(12) United States Patent
Gluschenkov et al.

(10) Patent No.: US 10,262,904 B2
(45) Date of Patent: Apr. 16, 2019

(54) VERTICAL TRANSISTOR TOP EPITAXY SOURCE/DRAIN AND CONTACT STRUCTURE

(71) Applicant: International Business Machines Corporation, Armonk, NY (US)

(72) Inventors: Oleg Gluschenkov, Tannersville, NY (US); Sanjay C. Mehta, Niskayuna, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/811,164

(22) Filed: Nov. 13, 2017

(65) Prior Publication Data
US 2018/0277446 A1    Sep. 27, 2018

Related U.S. Application Data

(63) Continuation of application No. 15/466,519, filed on Mar. 22, 2017.

(51) Int. Cl.
| | |
|---|---|
| *H01L 21/8238* | (2006.01) |
| *H01L 27/092* | (2006.01) |
| *H01L 29/167* | (2006.01) |
| *H01L 29/161* | (2006.01) |
| *H01L 21/761* | (2006.01) |
| *H01L 29/08* | (2006.01) |
| *H01L 29/78* | (2006.01) |
| *H01L 27/088* | (2006.01) |

(52) U.S. Cl.
CPC .... *H01L 21/823814* (2013.01); *H01L 21/761* (2013.01); *H01L 21/823885* (2013.01); *H01L 27/088* (2013.01); *H01L 27/092* (2013.01); *H01L 29/0847* (2013.01); *H01L 29/161* (2013.01); *H01L 29/167* (2013.01); *H01L 29/7827* (2013.01)

(58) Field of Classification Search
CPC .......... H01L 21/761; H01L 21/823885; H01L 27/092; H01L 29/161; H01L 29/167; H01L 29/7827; H01L 21/823487; H01L 27/1104
See application file for complete search history.

(56) References Cited

U.S. PATENT DOCUMENTS

| | | |
|---|---|---|
| 6,229,161 B1 | 5/2001 | Nemati et al. |
| 6,943,407 B2 | 9/2005 | Ouyang et al. |
| 8,796,093 B1 | 8/2014 | Cheng et al. |
| 8,841,701 B2 | 9/2014 | Lin et al. |

(Continued)

OTHER PUBLICATIONS

List of IBM Patents or Patent Applications Treated as Related Dated Nov. 13, 2017, 2 Pages.

(Continued)

*Primary Examiner* — A. Sefer
(74) *Attorney, Agent, or Firm* — Scully, Scott, Murphy & Presser, P.C.; Daniel P. Morris, Esq.

(57) ABSTRACT

An nFET vertical transistor is provided in which a p-doped top source/drain structure is formed in contact with an n-doped semiconductor region that is present on a topmost surface of a vertical nFET channel. The p-doped top source/drain structure is formed utilizing a low temperature (550° C. or less) epitaxial growth process.

14 Claims, 5 Drawing Sheets

(56) References Cited

U.S. PATENT DOCUMENTS

| | | |
|---|---|---|
| 8,946,029 B2 | 2/2015 | Wong et al. |
| 9,006,066 B2 | 4/2015 | Chi et al. |
| 9,087,922 B2 | 7/2015 | Sun et al. |
| 9,153,496 B2 | 10/2015 | Wong et al. |
| 9,337,340 B2 | 5/2016 | Chi et al. |
| 9,362,285 B2 | 6/2016 | Basker et al. |
| 9,368,512 B1 | 6/2016 | Cheng et al. |
| 9,391,200 B2 | 7/2016 | Liu et al. |
| 2006/0157804 A1 | 7/2006 | Ueda |
| 2009/0200540 A1* | 8/2009 | Bjoerk ............... H01L 29/0673 257/20 |
| 2009/0200605 A1* | 8/2009 | Bjoerk .................. B82Y 10/00 257/330 |
| 2014/0021485 A1* | 1/2014 | Cho .................... H01L 29/1054 257/77 |
| 2015/0123146 A1 | 5/2015 | Krishnan et al. |
| 2015/0236016 A1 | 8/2015 | Wann et al. |
| 2015/0325484 A1 | 11/2015 | Lin et al. |
| 2016/0093741 A1 | 3/2016 | Yang et al. |
| 2016/0197075 A1 | 7/2016 | Li et al. |
| 2016/0240623 A1* | 8/2016 | Chang .................. B82Y 10/00 |

OTHER PUBLICATIONS

Office Action dated Mar. 5, 2018 received in the parent U.S. Patent Application, namely U.S. Appl. No. 15/466,519.

Office Action dated Sep. 20, 2018 received in parent U.S. Application, namely U.S. Appl. No. 15/466,519.

Notice of Allowance dated Dec. 14, 2018 received in the parent U.S. Patent Application, namely U.S. Appl. No. 15/466,519.

\* cited by examiner

VERTICAL TRANSISTOR TOP EPITAXY SOURCE/DRAIN AND CONTACT STRUCTURE

BACKGROUND

The present application relates to a semiconductor structure and a method of forming the same. More particularly, the present application relates to a vertical transistor containing a top source/drain structure that is formed utilizing a low temperature epitaxial growth process.

Conventional vertical transistors are devices where the source-drain current flows in a direction normal to the substrate surface. In such devices, a vertical semiconductor pillar (or fin) defines the channel with the source and drain located at opposing ends of the semiconductor pillar. Vertical transistors are an attractive option for technology scaling for 5 nm and beyond.

Forming the top source/drain structure for vertical transistors is very challenging. Since the bottom source/drain structure and the gate structures are formed prior to the formation of the top source/drain structure, the top source/drain structure epitaxial formation is limited to temperatures lower than 550° C. Growing selective epitaxy at such low temperatures is very challenging, if not impossible. While selective growth of boron-doped silicon germanium (i.e., SiGe:B) for pFETs can be accomplished, the counterpart of selective epitaxial growth of phosphorus-doped silicon (i.e., Si:P) for nFETs does not work. Si based epitaxy at temperatures of 550° C. and below is very challenging. Using silicon germanium rather than silicon to carry the n-type dopant does not work either since the incorporation and activation of phosphorus or arsenic into silicon germanium is very low. In view of the above, there is a need to provide a method in which the top source/drain structure of at least the nFET is formed utilizing a low temperature epitaxial growth process.

SUMMARY

An nFET vertical transistor is provided in which a p-doped top source/drain structure is formed in contact with an n-doped semiconductor region that is present on a topmost surface of a vertical nFET channel. The p-doped top source/drain structure is formed utilizing a low temperature (550° C. or less) epitaxial growth process.

In one aspect of the present application, a semiconductor structure is provided. In one embodiment of the present application, the semiconductor structure may include an nFET vertical transistor located in an nFET device region of a semiconductor substrate. The nFET vertical transistor includes an nFET bottom source/drain structure comprising an n-doped semiconductor material region and an n-doped extension region. A vertical nFET channel extends upward from the n-doped extension region and an nFET gate stack is located on each sidewall of the vertical nFET channel. An n-doped semiconductor region is located on a topmost surface of the vertical nFET channel, and a p-doped top source/drain structure is located on physically exposed surfaces of the n-doped semiconductor region.

In some embodiments, the structure further includes a pFET vertical transistor located in a pFET device region of the semiconductor substrate. The pFET vertical transistor includes a pFET bottom source/drain structure comprising a p-doped semiconductor material region and a p-doped extension region. A vertical pFET channel extends upward from the p-doped extension region, and a pFET gate stack is located on each sidewall of the vertical pFET channel. A pFET top source/drain structure is located on a topmost surface of the vertical pFET channel. In one embodiment, the pFET top source/drain structure of the pFET vertical transistor and the p-doped top source/drain structure of the nFET vertical transistor both comprise a same p-type doped semiconductor material (e.g., a boron doped silicon germanium alloy).

In another aspect of the present application, a method of forming a semiconductor structure is provided. In one embodiment of the present application, the method may include forming a first structure in an nFET device region of a semiconductor substrate, the first structure comprising an nFET bottom source/drain structure comprising an n-doped semiconductor material region and an n-doped extension region, an nFET semiconductor channel material pillar extending upwards from the n-doped extension region, and an nFET gate stack located on each sidewall of the nFET semiconductor channel material pillar. Next, an n-type dopant is implanted into an upper portion of nFET semiconductor channel material pillar to provide an n-doped semiconductor region located on a topmost surface of a remaining portion of nFET semiconductor channel material pillar. A p-doped top source/drain structure is formed on physically exposed surfaces of the n-doped semiconductor region.

DETAILED DESCRIPTION

Figure 1:
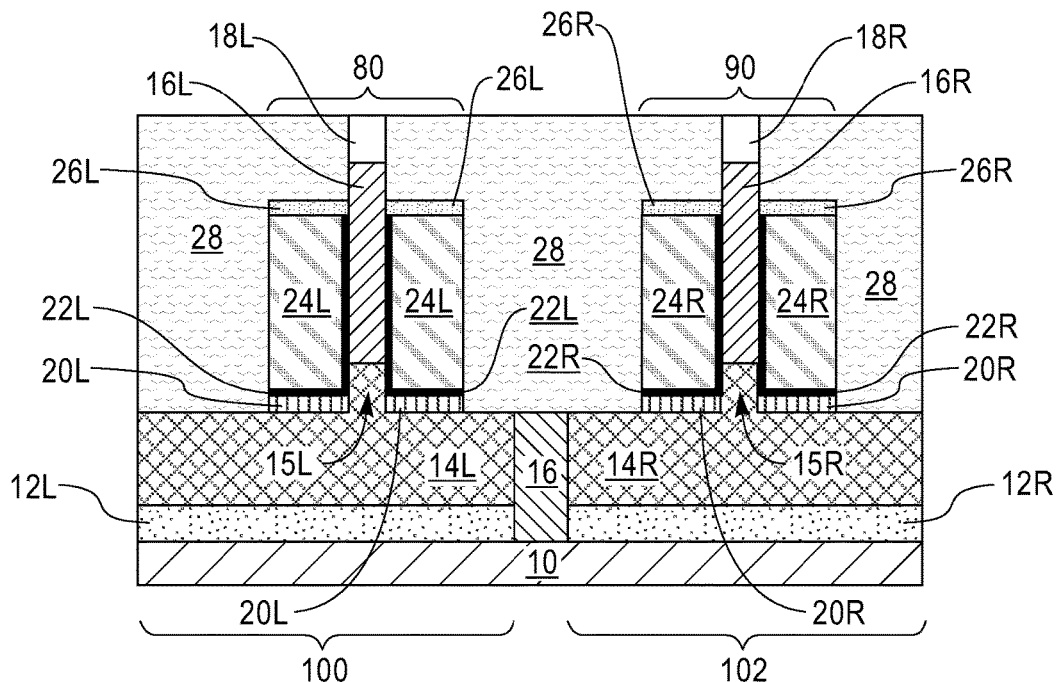
FIG. 1 is a cross sectional view of an exemplary semiconductor structure including a semiconductor substrate that contains an nFET vertical transistor in an nFET device region, and a pFET vertical transistor in a pFET device region, wherein an interlevel dielectric (ILD) material laterally surrounds each of the nFET vertical transistor and the pFET vertical transistor.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with the present application. The exemplary semiconductor structure of FIG. 1 includes a semiconductor substrate 10 that contains an nFET vertical transistor 80 (i.e., first structure) in an nFET device region 100, and a pFET vertical transistor 90 (i.e., second structure) in a pFET device region 102, wherein an interlevel dielectric (ILD) material 28 laterally surrounds each of the nFET vertical transistor 90 and the pFET vertical transistor 90; the nFET vertical transistor 80 and the pFET vertical transistor 90 at this point of the present application lack the top source/drain structure. An isolation structure 16 such as a trench isolation structure including a trench dielectric material can be formed between the nFET device region 100 and the pFET device region 102. Although the present application describes and illustrates forming both an nFET vertical transistor 80 and a pFET vertical transistor 90, the present application contemplates embodiments in which only the nFET vertical transistor 80 is formed.

The nFET vertical transistor 80 includes a p-doped semiconductor material punch through stop (PTS) layer 12L, an nFET bottom source/drain structure that includes an n-doped semiconductor material region 14L and an n-doped extension region 15L. In some embodiments, the p-doped semiconductor material PTS layer 12L may be omitted. As is shown, the n-doped semiconductor material region 14L of the nFET bottom source/drain structure is located on a topmost surface of the p-doped semiconductor material PTS layer 12L.

The nFET vertical transistor 80 also includes an nFET gate stack of an nFET gate dielectric material portion 22L and an nFET gate conductor material portion 24L that is located on each sidewall of the nFET semiconductor channel material pillar 16L. As is shown, the nFET gate dielectric portion 24L of the nFET gate stack has a vertical portion that directly contacts a sidewall of the nFET semiconductor channel material pillar 16L. An nFET bottom gate spacer 20L is located beneath each nFET gate stack (22L, 24L) and an nFET top gate spacer 26L is located atop each nFET gate stack (22L, 24L). In some embodiments, an nFET dielectric cap 18L may be located on a topmost surface of the nFET semiconductor channel material pillar 16L. In such an embodiment, the nFET dielectric cap 18L has a topmost surface that is coplanar with a topmost surface of the ILD material 28.

The pFET vertical transistor 90 includes an n-doped semiconductor material punch through stop (PTS) layer 12R, a pFET bottom source/drain structure that includes a p-doped semiconductor material region 14R and a p-doped extension region 15R. In some embodiments, the n-doped semiconductor material PTS layer 12R may be omitted. As is shown, the p-doped semiconductor material region 14R of the pFET bottom source/drain structure is located on a topmost surface of the n-doped semiconductor material PTS layer 12R.

The pFET vertical transistor 90 also includes a pFET gate stack of a pFET gate dielectric material portion 22R and a pFET gate conductor material portion 24R that is located on each sidewall of the pFET semiconductor channel material pillar 16R. As is shown, the pFET gate dielectric portion 24R of the pFET gate stack has a vertical portion that directly contacts a sidewall of the pFET semiconductor channel material pillar 16R. A pFET bottom gate spacer 20R is located beneath each pFET gate stack (22R, 24R) and a pFET top gate spacer 26R is located atop each pFET gate stack (22R, 24R). In some embodiments, a pFET dielectric cap 18R may be located on a topmost surface of the pFET semiconductor channel material pillar 16R. In such an embodiment, the pFET dielectric cap 18R has a topmost surface that is coplanar with the topmost surface of the ILD material 28 as well as the topmost surface of the nFET dielectric cap 18L.

The exemplary structure shown in FIG. 1 can be formed utilizing any technique that is capable of forming vertical transistors such as shown in FIG. 1. Such techniques, which may include various deposition steps and patterning processes, are well known to those skilled in the art. As such, and so as not to obscure the method of the present application, the processing details of forming the vertical transistors shown in FIG. 1 are not provided herein. In such techniques the nFET vertical transistor 80 can be formed prior to, or after, forming the pFET vertical transistor 90.

The semiconductor substrate 10 that may be employed in the present application may include at least one semiconductor material having semiconducting properties. Examples of semiconductor materials that may provide at least a portion of the semiconductor substrate 10 may include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In one embodiment, the semiconductor substrate 10 is a bulk semiconductor substrate. By "bulk" it is meant that the semiconductor substrate 10 is entirely composed of at least one semiconductor material, as defined above. In one example, the semiconductor substrate 10 may be entirely composed of silicon. In some embodiments, the bulk semiconductor substrate may include a multilayered semiconductor material stack including at least two different semiconductor materials, as defined above. In one example, the multilayered semiconductor material stack may comprise, in any order, a stack of Si and a silicon germanium alloy.

In another embodiment of the present application, the semiconductor substrate 10 comprises a topmost semiconductor material layer of a semiconductor-on-insulator (SOI) substrate. The SOI substrate would also include a handle substrate (not shown) including one of the above mentioned semiconductor materials, and an insulator layer (not shown) such as a buried oxide below the topmost semiconductor material layer.

In any of the embodiments mentioned above, the semiconductor material that provides the semiconductor substrate 10 may be a single crystalline semiconductor material. The semiconductor material that provides the semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

The p-doped semiconductor material PTS layer 12L includes a semiconductor material as defined above for the semiconductor substrate 10 and a p-type dopant. The semiconductor material that provides the p-doped semiconductor material PTS layer 12L may be the same as, or different from, the semiconductor material that provides the semiconductor substrate 10. The term "p-type" denotes the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. In some embodiments, the p-doped semiconductor material PTS layer 12L may have a p-type dopant concentration from $1 \times 10^{18}$ atoms/cm$^3$ to $1 \times 10^{19}$ atoms/cm$^3$. Other p-type dopant concentrations can be used so long as the p-type dopant concentration is sufficient to form a PTS layer. In some embodiments, the p-doped semiconductor material PTS layer 12L has an epitaxial relationship with the underlying semiconductor substrate 10.

The n-doped semiconductor material PTS layer 12R includes a semiconductor material as defined above for the semiconductor substrate 10 and an n-type dopant. The semiconductor material that provides the n-doped semiconductor material PTS layer 12R may be the same as, or different from, the semiconductor material that provides the semiconductor substrate 10. Also, the semiconductor material that provides the n-doped semiconductor material PTS layer 12R may be the same as, or different from, the semiconductor material that provides the p-doped semiconductor material PTS layer 12L. The term "n-type" denotes the addition of impurities that contributes free electrons to an intrinsic semiconductor. In a silicon containing semiconductor material, examples of n-type dopants, i.e., impurities, include, but are not limited to, antimony, arsenic and phosphorous. In some embodiments, the n-doped semiconductor material PTS layer 12R may have an n-type dopant concentration from $1 \times 10^{18}$ atoms/cm$^3$ to $1 \times 10^{19}$ atoms/cm$^3$. Other n-type dopant concentrations can be used so long as the n-type dopant concentration is sufficient to form a PTS layer. In some embodiments, the n-doped semiconductor material PTS layer 12R has an epitaxial relationship with the underlying semiconductor substrate 10.

The nFET bottom source/drain structure (14L, 15L) of the nFET vertical transistor 80 comprises at least one semiconductor material and an n-type dopant, as defined above. The at least one semiconductor material that can provide the nFET bottom source/drain structure (14L, 15L) of the nFET vertical transistor 80 may include one of the semiconductor materials mentioned above for the semiconductor substrate 10. The semiconductor material that provides the nFET bottom source/drain structure (14L, 15L) of the nFET vertical transistor 80 may be the same as, or different from, the semiconductor material that provides the nFET semiconductor channel material pillar 16L (to be defined in greater detail herein below). The nFET bottom source/drain structure (14L, 15L) of the nFET vertical transistor 80 may have an n-type dopant concentration from $4 \times 10^{20}$ atoms/cm$^3$ to $2 \times 10^{21}$ atoms/cm$^3$. Other n-type dopant concentrations can be used so long as the n-type dopant concentration is sufficient to form a source/drain structure.

The pFET bottom source/drain structure (14R, 15R) of the pFET vertical transistor 90 comprises at least one semiconductor material and a p-type dopant, as defined above. The at least one semiconductor material that can provide the pFET bottom source/drain structure (14R, 15R) of the pFET vertical transistor 90 may include one of the semiconductor materials mentioned above for the semiconductor substrate 10. The semiconductor material that provides the pFET bottom source/drain structure (14R, 15R) of the pFET vertical transistor 90 may be the same as, or different from, the semiconductor material that provides the pFET semiconductor channel material pillar 16R (to be defined in greater detail herein below). The pFET bottom source/drain structure (14R, 15R) of the pFET vertical transistor 90 may have a p-type dopant concentration from $4 \times 10^{20}$ atoms/cm$^3$ to $2 \times 10^{21}$ atoms/cm$^3$. Other p-type dopant concentrations can be used so long as the p-type dopant concentration is sufficient to form a source/drain structure.

The nFET semiconductor channel material pillar 16L of the nFET vertical transistor 80 is composed of one of the semiconductor materials mentioned above for the semiconductor substrate 10. In one embodiment, the nFET semiconductor channel material pillar 16L comprises a semiconductor material that can facilitate high electron mobility within the nFET vertical transistor 80. The nFET semiconductor channel material pillar 16L is typically non-doped, i.e., it is composed of an intrinsic semiconductor material. In some embodiments, the nFET semiconductor channel material pillar 16L is lightly p-type doped with a p-type dopant concentration not exceeding $1 \times 10^{18}$ atoms/cm$^3$. The nFET semiconductor channel material pillar 16L of the nFET vertical transistor 80 may have a height from 20 nm to 40 nm, and a width from 6 nm to 10 nm. Other heights and/or widths that are lesser than, or greater than, the aforementioned ranges may also be used for the nFET semiconductor channel material pillar 16L of the nFET vertical transistor 80.

The pFET semiconductor channel material pillar 16R of the pFET vertical transistor 90 is composed of one of the semiconductor materials mentioned above for the semiconductor substrate 10. In one embodiment, the pFET semiconductor channel material pillar 16R comprises a semiconductor material that can facilitate high electron mobility within the pFET vertical transistor 90. The pFET semiconductor channel material pillar 16R is typically non-doped, i.e., it is composed of an intrinsic semiconductor material. In some embodiments, the pFET semiconductor channel material pillar 16R is lightly n-type doped with an n-type dopant concentration not exceeding $1 \times 10^{18}$ atoms/cm$^3$. The pFET semiconductor channel material pillar 16R of the pFET vertical transistor 90 may have a height from 20 nm to 40 nm, and a width from 6 nm to 10 nm. Other heights and/or widths that are lesser than, or greater than, the aforementioned ranges may also be used for the pFET semiconductor channel material pillar 16R of the pFET vertical transistor 90. Typically, but not necessarily always, the height of the pFET semiconductor channel material pillar 16R is the same as the height of the nFET semiconductor channel material pillar 16L. In such an embodiment, the topmost surface of the pFET semiconductor channel material pillar 16R is coplanar with a topmost surface of the nFET semiconductor channel material pillar 16L.

The nFET and pFET bottom gate spacers (20L and 20R) may be composed of any dielectric spacer material including for example, silicon dioxide, silicon nitride or silicon oxynitride. The dielectric spacer material that provides the nFET bottom gate spacer 20L may be the same as, or different from, the dielectric spacer material that provides the pFET bottom spacer 20R. The nFET and pFET bottom gate spacers (20L and 20R) may have a thickness from 4 nm to 10 nm. Other thicknesses that are lesser than, or greater than, the aforementioned thickness range may also be employed in the present application as the thickness of the nFET and pFET bottom gate spacers (20L and 20R). As is shown in FIG. 1, a sidewall of the nFET bottom gate spacer 20L contacts a bottom portion of a sidewall of the n-doped extension region 15L, while a sidewall of the pFET bottom gate spacer 20R contacts a bottom portion of a sidewall of the p-doped extension region 15R.

The nFET and pFET top gate spacers (26L and 26R) may be composed of any dielectric spacer material including for example, silicon dioxide, silicon nitride or silicon oxynitride. The dielectric spacer material that provides the nFET top gate spacer 26L may be the same as, or different from, the dielectric spacer material that provides the pFET top spacer 26R. The nFET and/or pFET top gate spacer(s) (26L and 26R) may comprise a same dielectric spacer material as, or a different dielectric spacer material than, the nFET and/or pFET bottom gate spacer(s) (20L and 20R). The nFET and pFET top gate spacers (26L and 26R) may have a thickness from 4 nm to 10 nm. Other thicknesses that are lesser than, or greater than, the aforementioned thickness range may also be employed in the present application as the thickness of the nFET and pFET top gate spacers (26L and 26R).

The nFET and pFET dielectric caps (18L and 18R) may comprise any hard mask material such as, for example, silicon dioxide, silicon nitride and/or silicon oxynitride. The hard mask material that provides the nFET dielectric cap 18L may be the same as, or different from, the hard mask material that provides the pFET dielectric cap 18R. The hard mask materials that provide the nFET and pFET dielectric caps (18L and 18R) are compositional different from the dielectric spacer material that provides the nFET and pFET top gate spacers (26L and 26R). The nFET and pFET dielectric caps (18L and 18R) may have a thickness from 4 nm to 10 nm. Other thicknesses that are lesser than, or greater than, the aforementioned thickness range may also be employed in the present application as the thickness of the dielectric caps (18L and 18R).

The nFET and pFET gate dielectric portions (22L and 22R) may be composed of a gate dielectric material such as, for example, an oxide, nitride, and/or oxynitride. In one example, the nFET and pFET gate dielectric portion (22L and 22R) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as nFET and pFET gate dielectric portion (22L and 22R). The gate dielectric material that provides the nFET gate dielectric portion 22L may be the same as, or different from, the gate dielectric material that provides the pFET gate dielectric portion 22R. In one embodiment, the gate dielectric material that provides the nFET and pFET gate dielectric portion (22L and 22R) can have a thickness in a range from 1 nm to 10 nm. Other thicknesses that are lesser than, or greater than, the aforementioned thickness range can also be employed for the gate dielectric material that provides nFET and pFET gate dielectric portion (22L and 22R).

The nFET and pFET gate conductor portions (24L and 24R) may be composed of a gate conductor material. The gate conductor material used in providing the nFET and pFET gate conductor portions (24L and 24R) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor material that provides the nFET gate conductor portion 24L may be the same as, or different from, the gate conductor material that provides the pFET gate conductor portion 24R. In one embodiment, the gate conductor material of the nFET gate conductor portion 24L may comprise an nFET gate metal, while the gate conductor material of the pFET gate conductor portion 24R may comprise a pFET gate metal. In one embodiment, the nFET and pFET gate conductor portions (24L and 24R) can have a thickness from 50 nm to 200 nm. Other thicknesses that are lesser than, or greater than, the aforementioned thickness range can also be employed for the nFET and pFET gate conductor portions (24L and 24R).

The ILD material 28 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric such as SiLK™ can be used as ILD material 28. The use of a self-planarizing dielectric material as the ILD material 28 may avoid the need to perform a subsequent planarizing step.

In one embodiment, the ILD material 28 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 28, a planarization process or an etch back process follows the deposition of the dielectric material that provides the ILD material 28.

Figure 2:
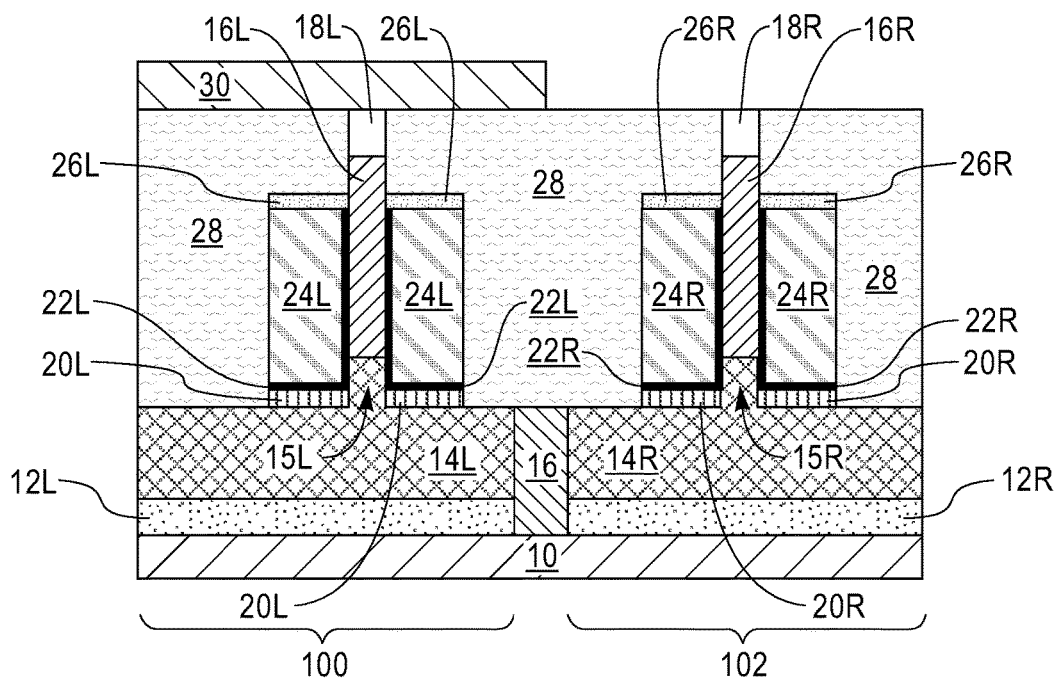
FIG. 2 is a cross sectional view of the exemplary semiconductor structure of FIG. 1 after forming a hard mask protecting the nFET device region.

Referring now to FIG. 2, there is illustrated the exemplary semiconductor structure of FIG. 1 after forming a hard mask 30 protecting the nFET device region 100. As is shown, the hard mask 30 is located on the topmost surface of the ILD material 28 that is present in the nFET device region 100 as well as a topmost surface of the nFET dielectric cap 18L. The topmost surfaces of the ILD material 28 and the pFET dielectric cap 18R in the pFET device region 102 are physically exposed, i.e., they are not covered by the hard mask 30 (hard mask 30 may be referred to an nFET hard mask).

The hard mask 30 may be formed by providing a blanket layer of hard mask material over the ILD material 28 in both the nFET device region 100 and the pFET device region 102. The hard mask material that can provide the hard mask 30 may include a dielectric material that has a different etch rate in a specific etchant as compared to the ILD material 28, and the pFET dielectric cap 18R. By way of an example, the hard mask material that may provide hard mask 30 may include silicon dioxide, silicon nitride and/or silicon oxynitride. The blanket layer of hard mask material that provides the hard mask 30 may be formed utilizing a deposition process such as, for example, chemical vapor deposition (CVD) and plasma enhanced chemical vapor deposition (PECVD). In some embodiments, the blanket layer of hard mask material that provides the hard mask 30 may be formed by a thermal growth process such as, for example, thermal oxidation and/or thermal nitridation. In yet other embodiments, the blanket layer of hard mask material that provides the hard mask 30 may be formed utilizing a combination of, and in any order, a deposition process and a thermal growth process. The blanket layer of hard mask material (and thus the hard mask 30) may have a thickness from 20 nm to 100 nm. Other thicknesses that are lesser than, or greater than the aforementioned thicknesses values may also be employed as the thickness of the blanket layer of hard mask material (and thus the hard mask 30).

Following the formation of the blanket layer of hard mask material, the blanket layer of hard mask material is patterned to provide hard mask 30. In one embodiment, the patterning of the blanket layer of hard mask material may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process.

Figure 3:
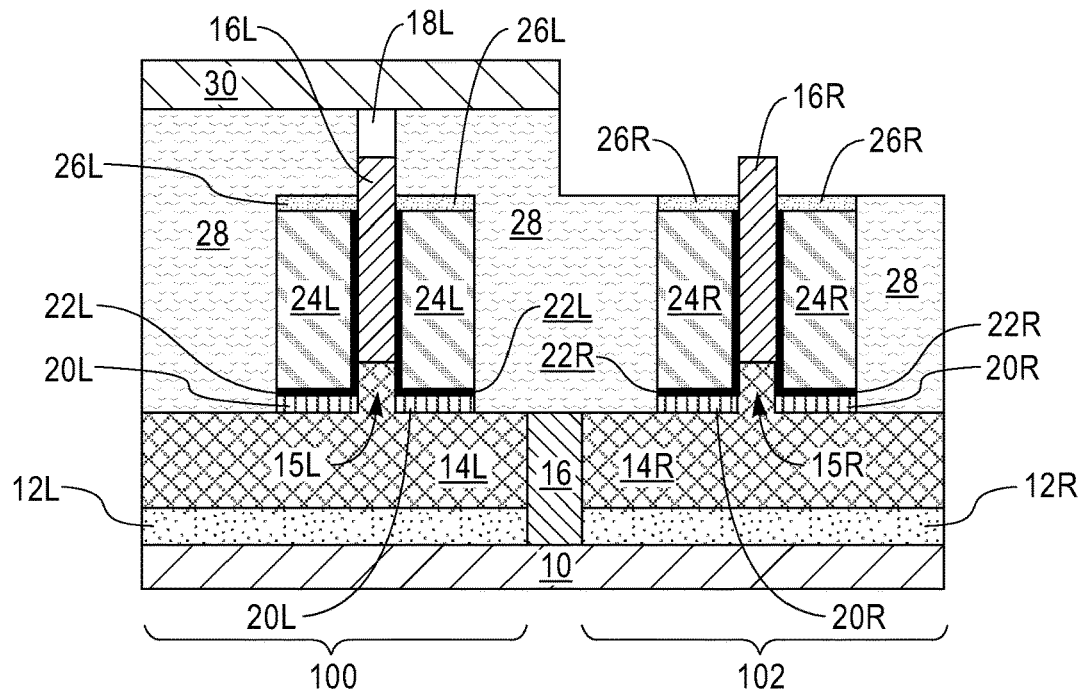
FIG. 3 is a cross sectional view of the exemplary semiconductor structure of FIG. 2 after physically exposing an upper portion of a pFET semiconductor channel material pillar of the pFET vertical transistor.

Referring now to FIG. 3, there is illustrated the exemplary semiconductor structure of FIG. 2 after physically exposing an upper portion of the pFET semiconductor channel material pillar 16R of the pFET vertical transistor 90. The physical exposure of the upper portion of the pFET semiconductor channel material pillar 16R of the pFET vertical transistor 90 may include utilizing one or more material removal processes. For example, a first etch, i.e., a recess etch, may be used to recess an upper portion of the ILD material 28 in the pFET device region 102, followed by a second etch or a planarization process which can be used to remove the pFET dielectric cap 18R. In some embodiments, the pFET dielectric cap 18R can be removed first prior to recessing the upper portion of the ILD material 28. In another embodiment, a single etch may be used to remove an upper portion of the ILD material 28 in the pFET device region 102 and the pFET dielectric cap 18R. In any of the embodiments, an upper portion of the pFET top gate spacer 26R may be removed.

As is shown, the sidewalls and a topmost surface of the upper portion of the pFET semiconductor channel material 16R are physically exposed and can be subjected to further processing (i.e., formation of pFET top source/drain structure 32).

Figure 4:
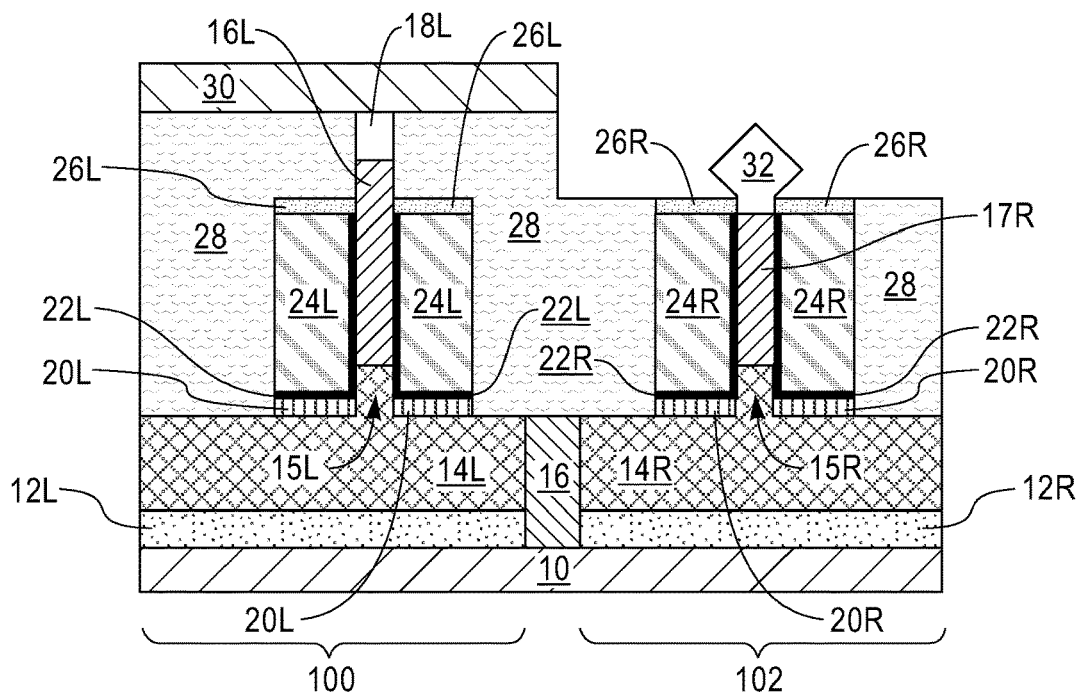
FIG. 4 is a cross sectional view of the exemplary semiconductor structure of FIG. 3 after forming a pFET top source/drain structure.

Referring now to FIG. 4, there is illustrated the exemplary semiconductor structure of FIG. 3 after forming a pFET top source/drain structure 32. The pFET top source/drain structure 32 can be formed by first recessing an upper portion of the pFET semiconductor channel material pillar 16R and then forming the pFET top source/drain structure 32 from the physically exposed surfaces of the upper portion of recessed pFET semiconductor channel material pillar 16R. The pFET top source/drain structure 32 can be formed utilizing a single epitaxial growth process or a two step epitaxial growth process. When a two step epitaxial growth process is employed the stub (i.e., base portion) of the pFET top source/drain structure 32 may have a first p-type dopant concentration that is less than a second p-type dopant concentration of the top portion (i.e., diamond shaped portion) of the pFET top source/drain structure 32. For example, the stub of the pFET top source/drain structure 32 can be formed first and could have a p-type dopant concentration of about $1 \times 10^{20}$, while the upper portion of the pFET top source/drain structure 32 is then grown from the stub and it may have a p-type dopant concentration of about $1 \times 10^{21}$. Typically, the p-type dopant that provides the pFET top source/drain structure 32 is introduced during the epitaxial growth process. Alternatively, the p-type dopant of the pFET top source/drain structure 32 can be introduced after the epitaxial growth process utilizing an angled implantation process, followed by a quick laser anneal.

The pFET top source/drain structure 32 includes a semiconductor material and a p-type dopant as defined above; collectively the semiconductor material and the p-type dopant that provide the pFET top source/drain structure 32 can be referred to as a p-doped semiconductor material. The semiconductor material that provides the pFET top source/drain structure 32 may include one of the semiconductor materials mentioned above for the semiconductor substrate 10. The semiconductor material that provides the pFET top source/drain structure 32 may be the same as, or different from, the semiconductor material that provides the pFET semiconductor channel material pillar 16R. In one embodiment, the pFET top source/drain structure 32 may include a boron doped silicon germanium alloy.

The pFET top source/drain structure 32 may be formed utilizing a low temperature epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the p pFET top source/drain structure 32 has an epitaxial relationship with the physically exposed surfaces of a remaining portion of the recessed pFET semiconductor channel material pillar 16R.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). As mentioned above, the pFET top source/drain structure 32 is formed utilizing a low temperature epitaxial growth process. By "low temperature" it is meant a temperature of 550° C. or less. The low temperature epitaxial is employed in the present application in forming only the top source/drain structure of the vertical transistor of the present application; low temperature is required since the gate stack is already present. The semiconductor material that provides at least a portion of the bottom source/drain structure can be epitiaxial grown utilizing higher temperature since the gate stacks are not present during the epitaxial growth process. A typical temperature range for the epitaxial growth of the pFET top source/drain structure 32 is from 450° C. to 500° C. The epitaxial growth of the pFET top source/drain structure 32 can be performed utilizing any well known precursor gas or gas mixture. Carrier gases like hydrogen, nitrogen, helium and argon can be used. A p-type dopant is typically added to the precursor gas or gas mixture.

As mentioned above, the pFET semiconductor channel material pillar is recessed prior to epitaxial growth of the pFET top source/drain structure 32. The remaining portion of the pFET semiconductor channel material pillar 16R may be referred to as the vertical pFET channel 17R. As is shown, the vertical pFET channel 17R is positioned beneath a bottommost surface of the pFET top source/drain structure 32 and a topmost surface of the bottom source/drain structure (14R, 15R). The vertical pFET channel 17R is either undoped (e.g., an intrinsic semiconductor) or lightly n-type doped with a concentration of n-type dopants not exceeding $1 \times 10^{18}$ atoms/cm$^3$.

The pFET top source/drain structure 32 has a p-type dopant concentration that is typically within the range of $4 \times 10^{20}$ atoms/cm$^3$ to $3 \times 10^{21}$ atoms/cm$^3$. The pFET top source/drain structure 32 may have a faceted (i.e., non-planar) top surface. In one embodiment, the pFET top source/drain structure 32 is diamond shaped as is shown in FIG. 4.

Figure 5:
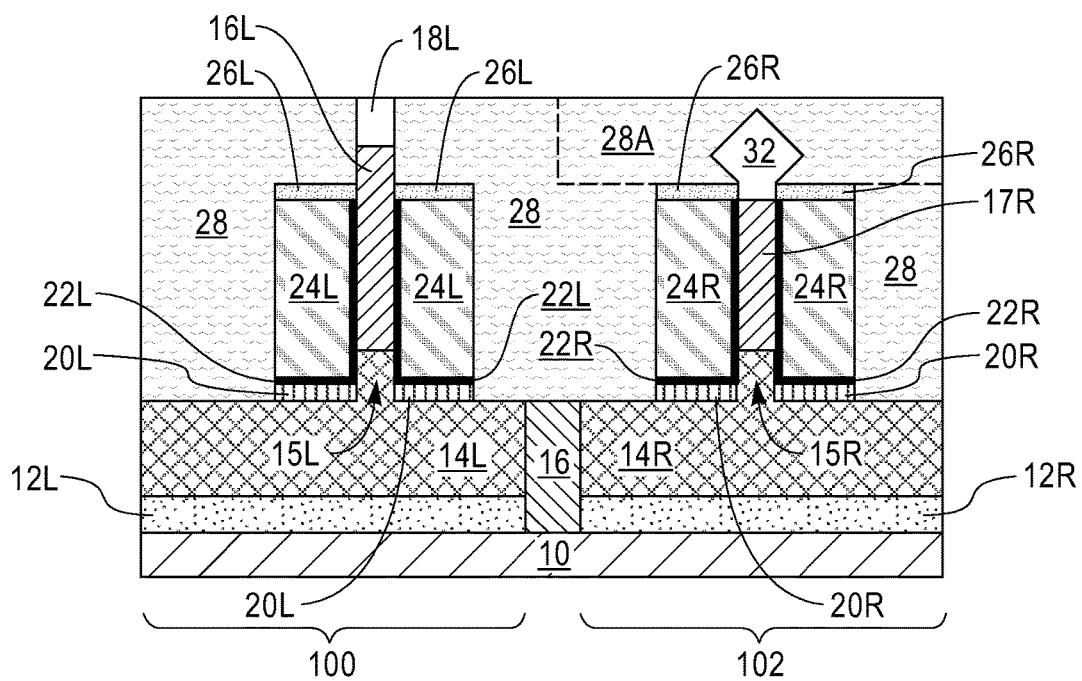
FIG. 5 is a cross sectional view of the exemplary semiconductor structure of FIG. 4 after removing the hard mask protecting the nFET device region and forming additional ILD material.

Referring now to FIG. 5, there is illustrated the exemplary semiconductor structure of FIG. 4 after removing the hard mask 30 protecting the nFET device region 100 and forming additional ILD material 28A. The removal of the hard mask 30 and forming the additional ILD material 28A may be performed in any order. In one embodiment, the hard mask 30 can be removed prior to forming the additional ILD material 28A. In another embodiment, the additional ILD material 28A is formed prior to removing the hard mask 30.

In either embodiment, the hard mask 30 can be removed utilizing a material removal process that is capable of selectively removing the hard mask material that provides the hard mask 30. In one example, an etch may be used to remove the hard mask 30. In another example, a planarization process such as, for example, chemical mechanical polishing (CMP) or grinding may be used to remove the hard mask 30. In either instance, the removal of the hard mask 30 physically exposes the nFET device region 100 for further processing.

The additional ILD material 28A may include one of the dielectric materials mentioned above for ILD material 28. In some embodiments, the additional ILD material 28A may include a same dielectric material as ILD material 28. In yet other embodiments, the additional ILD material 28A may include a different dielectric material than ILD material 28. In FIG. 5, the dotted lines represent a possible material interface between the additional ILD material 28A and the ILD material 28. Such a material interface is not present when the dielectric material that provides the additional ILD material 28A is the same as the dielectric material that provides ILD material 28. The additional ILD material 28A may be formed utilizing one of the techniques mentioned above for forming ILD material 28.

Figure 6:
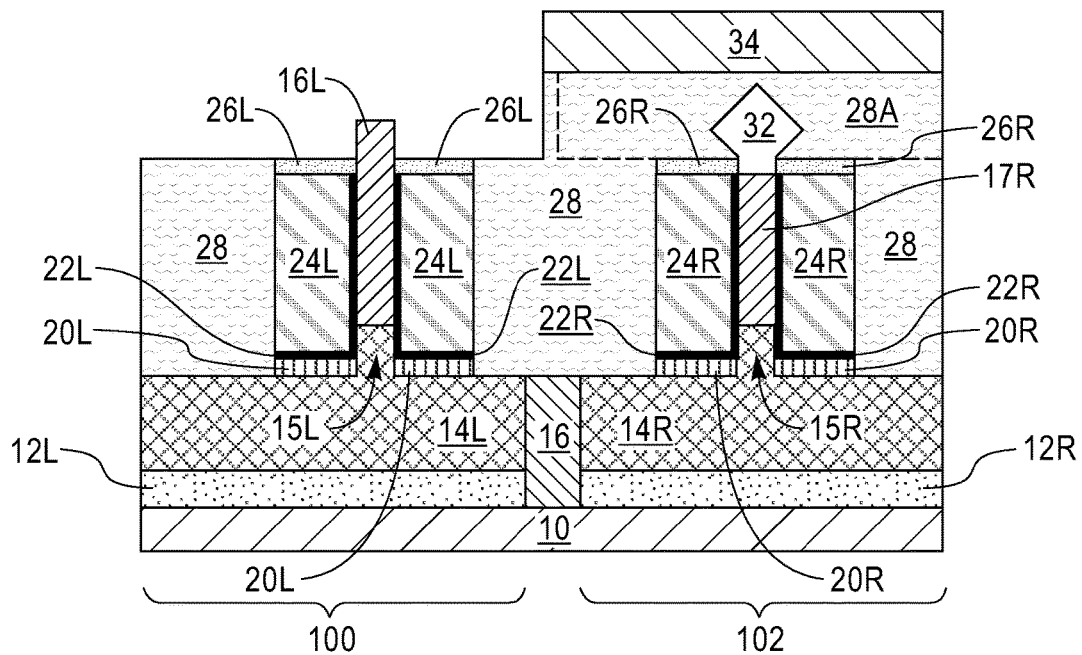
FIG. 6 is a cross sectional view of the exemplary semiconductor structure of FIG. 5 after forming a hard mask protecting the pFET device region, and after physically exposing an upper portion of the nFET semiconductor channel material pillar.

Referring now to FIG. 6, there is illustrated the exemplary semiconductor structure of FIG. 5 after forming a hard mask 34 protecting the pFET device region 102, and after physically exposing an upper portion of the nFET semiconductor channel material pillar 16L.

The hard mask 34 may include one of the hard mask materials mentioned above for hard mask 30. The hard mask material that provides hard mask 34 is capable of withstanding 450° C. anneals. The hard mask 34 may be formed utilizing the processing mentioned above in forming the hard mask 30 (i.e., formation of a blanket layer of hard mask material, and thereafter patterning the blanket layer of hard mask material). The hard mask 34 may be referred to a pFET hard mask since it covers the pFET device region 102, while leaving the nFET device region 100 physically exposed for further processing.

The physical exposure of the upper portion of the nFET semiconductor channel material pillar 16L of the nFET vertical transistor 80 may include utilizing one or more material removal processes. For example, a first etch, i.e., a recess etch, may be used to recess an upper portion of the ILD material 28 in the nFET device region 100, followed by a second etch or a planarization process which can be used to remove the nFET dielectric cap 18L. In some embodiments, the nFET dielectric cap 18L can be removed first prior to recessing the upper portion of the ILD material 28. In another embodiment, a single etch may be used to remove an upper portion of the ILD material 28 in the nFET device region 100 and the first dielectric cap 18L. In any of the embodiments, an upper portion of the nFET top gate spacer 26L may be removed.

As is shown, the sidewalls and a topmost surface of the upper portion of the nFET semiconductor channel material pillar 16L are physically exposed and can be subjected to further processing (i.e., formation of an n-doped semiconductor region 36 and a p-doped top source/drain structure 38).

Figure 7:
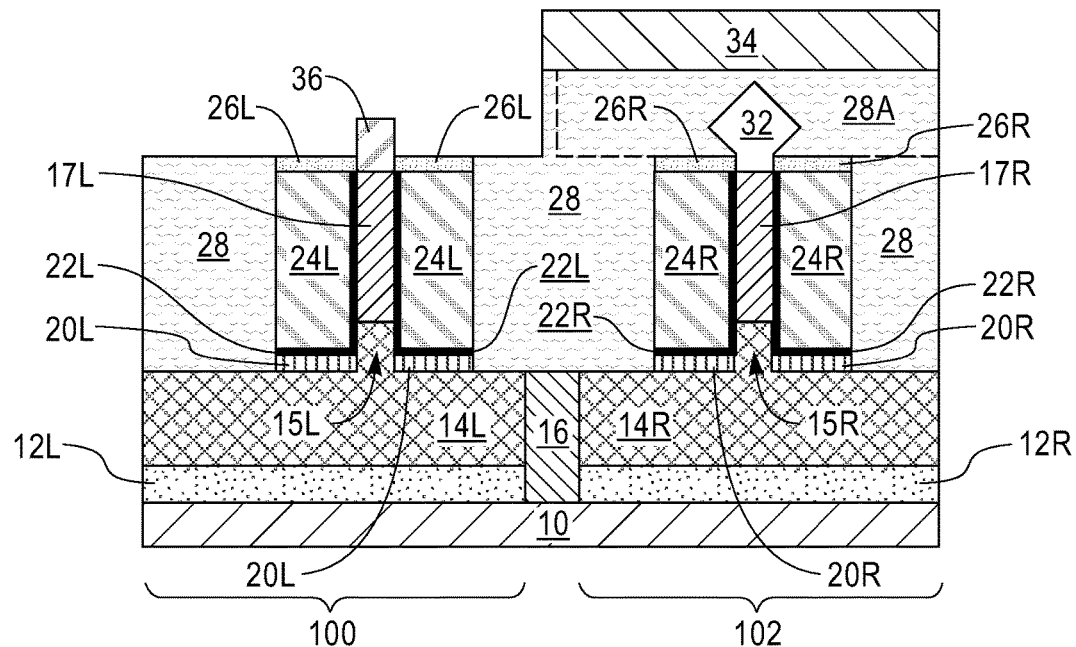
FIG. 7 is a cross sectional view of the exemplary semiconductor structure of FIG. 6 after forming a highly n-doped semiconductor region in the upper portion of the nFET semiconductor channel material pillar.

Referring now to FIG. 7, there is illustrated the exemplary semiconductor structure of FIG. 6 after forming a highly n-doped semiconductor region 36 in the upper portion of the nFET semiconductor channel material pillar 16L. The highly n-doped semiconductor region 36 includes the same semiconductor material as the nFET semiconductor channel material pillar 16L and an n-type dopant. The highly n-doped semiconductor region 36 forms an extension to the p-doped top source/drain structure 38 to be subsequently formed. The highly n-doped semiconductor region 36 is formed by implanting an n-type dopant such as, for example, arsenic or phosphorus, into the upper portion of the nFET semiconductor channel material pillar 16L. The implantation step can be conducted at an elevated substrate temperature of about 450° C. to prevent complete amorphization of the nFET semiconductor channel material pillar 16L. The energy, dose, and tilt angle of the implantation process is selected to yield a desired n-type dopant concentration and distribution in the upper portion of the nFET semiconductor channel material pillar 16L. The highly n-doped semiconductor region 36 contains an n-type dopant concentration of greater than $1 \times 10^{21}$ atoms/cm³. A typical range of the n-type dopant that provides the highly n-doped semiconductor region 36 is from $1 \times 10^{21}$ atoms/cm³ to $3 \times 10^{21}$ atoms/cm³. Following implantation, an anneal is performed to anneal out the damage caused by the implantation process and to activate the n-type dopants that are implanted. The anneal (i.e., recrystallization anneal, millisecond, or nanosecond anneal) may be performed utilizing a laser anneal or any other type of anneal that does not interfere with the gate stack structure. This anneal is performed either at or below 500° C. for prolonged periods of time from minutes to hours, or, alternatively, at temperatures of from about 800° C. to about 1000° C. for several 100's of microseconds. In the case of nanosecond-scale laser annealing, multiple nanosecond-scale laser pulses or exposures can be employed to make the cumulative high-temperature duration of from about 100 nanoseconds to several microseconds. The shorter duration of nanosecond annealing allow for using higher anneal temperature of from about 1100° C. to about 1300° C. without much impact on the gate stack. Combinations of longer low-temperature and shorter high-temperature annealing can be employed to heal the implant damage (long anneals) and activated the dopants (short-scale anneals).

The remaining portion of the nFET semiconductor channel material pillar 16L that is located beneath the highly n-doped semiconductor region 36 may be referred to as a vertical nFET channel 17L. The vertical nFET channel 17L is located beneath a bottommost surface of the highly n-doped semiconductor region 36 and atop the topmost surface of the bottom n-doped source/drain structure (14L, 15L). The vertical nFET channel 17L is either undoped (e.g., an intrinsic semiconductor) or lightly p-type doped with a concentration of p-type dopants not exceeding $1 \times 10^{18}$ atoms/cm³.

Figure 8:
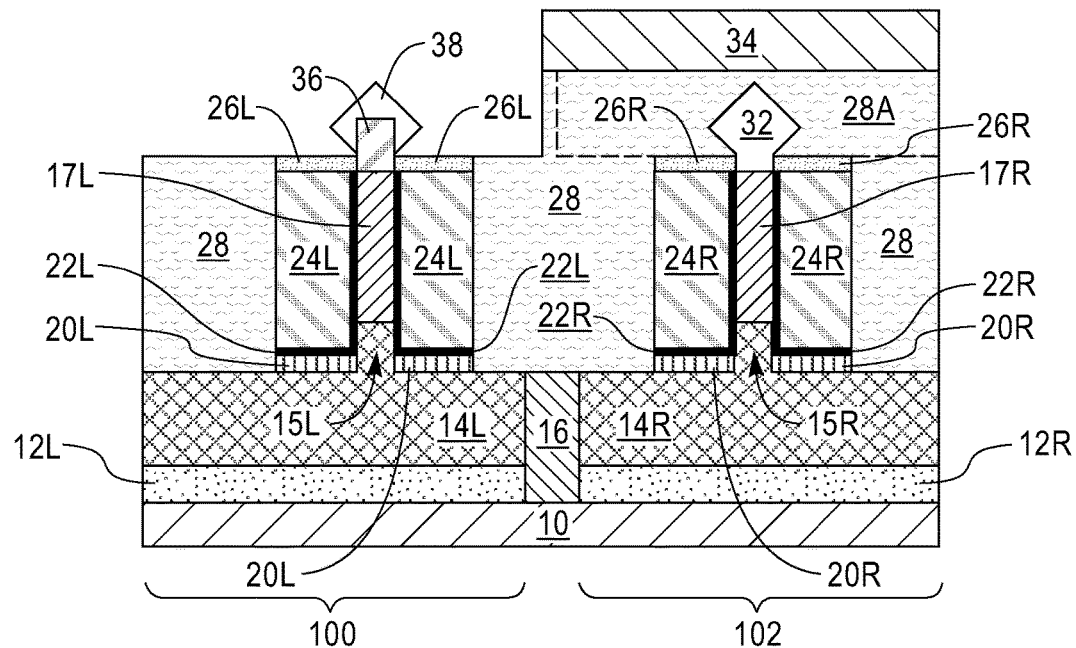
FIG. 8 is a cross sectional view of the exemplary semiconductor structure of FIG. 7 after forming a highly p-doped top source/drain structure on physically exposed surfaces of the highly n-doped semiconductor region.

Referring now to FIG. 8, there is illustrated the exemplary semiconductor structure of FIG. 7 after forming highly p-doped top source/drain structure 38 on physically exposed surfaces of the highly n-doped semiconductor region 36. Thus, and within the nFET device region 100, a p-n junction between the highly p-doped top source/drain structure 38 and the highly n-doped semiconductor region 36 is formed. This p-n junction that is formed in the nFET device region 100 behaves as an ohmic contact when biased. This is in part due to forming a highly degenerate n- and p-semiconductor on both sides of the junction.

The p-doped top source/drain structure 38 includes a semiconductor material and a p-type dopant as defined above. The semiconductor material of the p-doped top source/drain structure 38 may include one of the semiconductor materials mentioned above for the semiconductor substrate. The semiconductor material that provides the p-doped top source/drain structure 38 may be the same as, or different from, the semiconductor material that provides the nFET semiconductor channel material pillar 16L. The semiconductor material that provides the p-doped top source/drain structure 38 may be the same as the p-doped semiconductor material that provides the pFET top source/drain structure 32. In one embodiment, the p-doped top source/drain structure 38 may include a boron doped silicon germanium alloy. The concentration of p-type dopant that is present in the p-doped top source/drain structure 38 is greater than $1 \times 10^{21}$ atoms/cm³. A typical concentration range of the p-type dopant that is present in the p-doped top source/drain structure 38 is from $1 \times 10^{21}$ atoms/cm³ to $3 \times 10^{21}$ atoms/cm³.

The p-doped top source/drain structure 38 may be formed utilizing an epitaxial growth (or deposition) process, as defined above. The epitaxial growth of the p-doped top source/drain structure 38 may be performed at the same low temperature as mentioned above for forming the pFET top source/drain structure 32. The p-doped top source/drain structure 38 may have a faceted top surface. In some embodiments, and as shown, the p-doped top source/drain structure 38 is diamond shaped.

Figure 9:
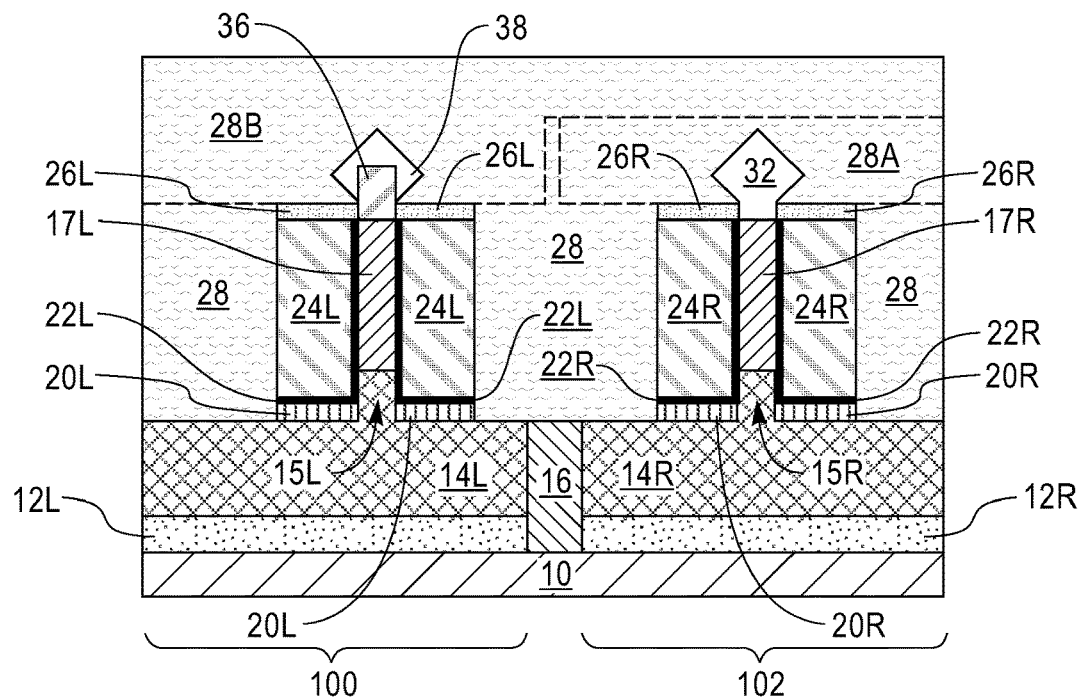
FIG. 9 is a cross sectional view of the exemplary semiconductor structure of FIG. 8 after removing the hard mask protecting the pFET device region and forming additional ILD material.

Referring now to FIG. 9, there is illustrated the exemplary semiconductor structure of FIG. 8 after removing the hard mask 34 protecting the pFET device region and forming additional ILD material 28B. The removal of the hard mask 34 and forming the additional ILD material 28B may be performed in any order. In one embodiment, the hard mask 34 can be removed prior to forming the additional ILD material 28B. In another embodiment, the additional ILD material 28B is formed prior to removing the hard mask 34.

In either embodiment, the hard mask 34 can be removed utilizing a material removal process that is capable of selectively removing the hard mask material that provides the hard mask 34. In one example, an etch may be used to remove the hard mask 34. In another example, a planarization process such as, for example, chemical mechanical polishing (CMP) or grinding may be used to remove the hard mask 34. In either instance, the removal of the hard mask 34 physically exposes the nFET device region 102.

The additional ILD material 28B may include one of the dielectric materials mentioned above for ILD material 28. In some embodiments, the additional ILD material 28B may include a same dielectric material as ILD material 28. In yet other embodiments, the additional ILD material 28B may include a different dielectric material than ILD material 28. Additional ILD material 28B may be composed of a dielectric material that may be the same as, or different from, additional ILD material 28A. In FIG. 9, the dotted lines represent possible material interfaces between the additional ILD 28A, the additional ILD material 28B and the ILD material 28. Such material interfaces are not present when the dielectric material that provides the additional ILD materials 28A and 28B is the same as the dielectric material that provides ILD material 28. The additional ILD material 28B may be formed utilizing one of the techniques mentioned above for forming ILD material 28. Collectively, ILD material 28, and the additional ILD materials 28A and 28B may be referred to herein as a planarizing dielectric material structure. In one embodiment, the planarizing dielectric material structure (28, 28A, 28B) may include three compositionally different dielectric materials. In another embodiment, the planarizing dielectric material structure (28, 28A, 28B) may include two compositionally different dielectric materials. In yet another embodiment, the planarizing dielectric material structure (28, 28A, 28B) includes a single dielectric material.

As is shown, planarizing dielectric material structure (28, 28A, 28B) laterally surrounds the nFET vertical transistor 80 and the pFET vertical transistor 90 and is present above each of the top source/drain structure (38, 32).

FIG. 9 illustrates a semiconductor structure in accordance with the present application. The structure includes an nFET vertical transistor 80 located in an nFET device region 100 of a semiconductor substrate 10. The nFET vertical transistor 80 includes an nFET bottom source/drain structure comprising an n-doped semiconductor material region 14L and an n-doped extension region 15L. A vertical nFET channel 17L extends upward from the n-doped extension region 15L, and an nFET gate stack (22L, 24L) is located on each sidewall of the vertical nFET channel 17L. An n-doped semiconductor region 36 is located on a topmost surface of the vertical nFET channel 36, and a p-doped top source/drain structure 38 is located on physically exposed surfaces of the n-doped semiconductor region 36. As is shown, the sidewalls of the n-doped extension region 15L, the vertical nFET channel 17L, and the n-doped semiconductor region 36 are vertically aligned to each other.

The structure further includes a pFET vertical transistor 90 located in a pFET device region 102 of the semiconductor substrate 10. The pFET vertical transistor 90 includes a pFET bottom source/drain structure comprising a p-doped semiconductor material region 14R and a p-doped extension region 15R. A vertical pFET channel 17R extends upward from the p-doped extension region 15R, and a pFET gate stack (22R, 24R) is located on each sidewall of the vertical pFET channel 17R. A pFET top source/drain structure 32 is located on a topmost surface of the vertical pFET channel 17R. In one embodiment, the pFET top source/drain structure 32 of the pFET vertical transistor 90 and the p-doped top source/drain structure 38 of the nFET vertical transistor 80 both comprise a same p-type doped semiconductor material (e.g., a boron doped silicon germanium alloy).

Although the present application describes and illustrates the formation of the pFET top source/drain structure 32 in the pFET device region 102 prior to forming the highly n-doped semiconductor region 36 and the highly p-doped top source/drain structure 38 in the nFET device region 100, the order of formation may be reversed such that the highly n-doped semiconductor region 36 and the highly p-doped top source/drain structure 38 are formed in the nFET device region 100 prior to forming the pFET top source/drain structure 32 in the pFET device region 102.

Also, and in some embodiments (not shown), it is possible to physically expose the semiconductor channel material pillars (16L, 16R) in both the nFET device region 100 and the pFET device region 102 simultaneously. Next, the highly n-doped semiconductor region 36 can be formed into the upper portion of the nFET semiconductor channel material pillar 16L utilizing a masked implantation process, and thereafter a single epitaxial growth process can be used to form the highly p-doped top source/drain structure 38 in the nFET device region 100 and the pFET top source/drain structure 32 in the pFET device region 102.

Figure 10:
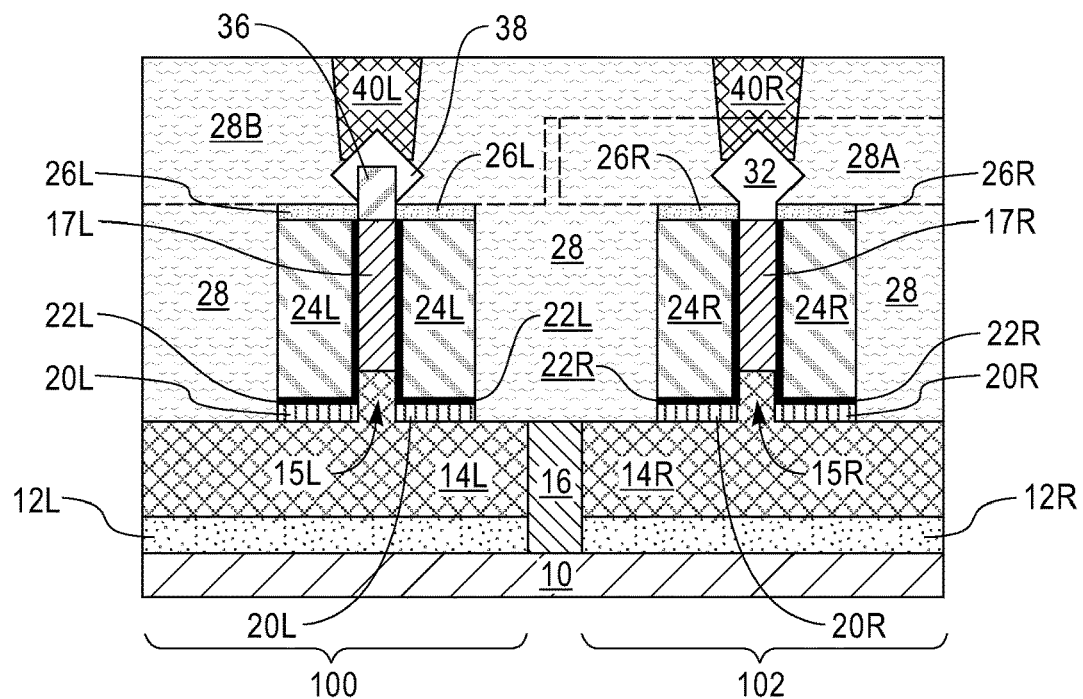
FIG. 10 is a cross sectional view of the exemplary semiconductor structure of FIG. 9 after forming a metal contact structure contacting the highly p-doped top source/drain structure and another metal contact structure contacting the pFET top source/drain structure.

Referring now to FIG. 10, there is illustrated the exemplary semiconductor structure of FIG. 9 after forming a metal contact structure 40L contacting the p-doped top source/drain structure 38 and another metal contact structure 40R contacting the pFET top source/drain structure 32. Each metal contact structure 40L, 40R extends through an upper portion of the planarizing dielectric material structure (28, 28A, 28B) and has a topmost surface that is coplanar with a topmost surface of the planarizing dielectric material structure (28, 28A, 28B). Each metal contact structure 40L, 40R can be formed by first providing contacting openings (not shown) in the upper portion of the planarizing dielectric material structure (28, 28A, 28B) that physically expose a surface of the top source/drain structure (38, 32) located in the nFET device region 100 and the pFET device region 102. Next, at least a contact metal or metal alloy such as, for example, copper, tungsten or a copper tungsten alloy is formed into each of the contact openings. The contact metal or metal alloy may be formed utilizing a deposition process such as, for example, chemical vapor deposition, plasma enhanced chemical vapor deposition, sputtering, physical vapor deposition or plating. A diffusion barrier material liner such as titanium, titanium, tantalum or tantalum nitride may be formed into each contact opening prior to filling the same with the contact metal or metal alloy. A planarization process such as, for example, chemical mechanical polishing and/or grinding may be employed after the contact metal or metal alloy fill so as to provide the planar structure shown in FIG. 10.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
  forming a first structure in an nFET device region of a semiconductor substrate, the first structure comprising an nFET bottom source/drain structure comprising an n-doped semiconductor material region and an n-doped extension region, an nFET semiconductor channel material pillar extending upwards from the n-doped extension region, and an nFET gate stack located on each sidewall of the nFET semiconductor channel material pillar, wherein an interlevel dielectric material (ILD) laterally surrounds the first structure and has a topmost surface that is located above a topmost surface of the nFET semiconductor channel material pillar;
  recessing the ILD material to physically expose the topmost surface and a sidewall surface of the nFET semiconductor channel material pillar;
  implanting, after the recessing of the ILD material, an n-type dopant into an upper portion of nFET semiconductor channel material pillar to provide an n-doped semiconductor region located on a remaining portion of nFET semiconductor channel material pillar; and
  forming a p-doped top source/drain structure on physically exposed surfaces of the n-doped semiconductor region.

2. The method of claim 1, wherein the forming the p-doped top source/drain structure is performed utilizing an epitaxial growth process.

3. The method of claim 2, wherein the top epitaxial growth process is carried out at a temperature of 550° C. or less.

4. The method of claim 1, wherein sidewalls of the n-doped extension region, the remaining portion of nFET semiconductor channel material pillar, and the n-doped semiconductor region are vertically aligned to each other.

5. The method of claim 1, wherein the n-doped semiconductor region has an n-type dopant concentration greater than $1\times10^{21}$ atoms/cm$^3$, and the p-doped top source/drain structure comprises a semiconductor material having a p-type dopant concentration greater than $1\times10^{21}$ atoms/cm$^3$.

6. The method of claim 5, wherein the p-doped top source/drain structure comprises a boron doped silicon germanium alloy.

7. The method of claim 1, further comprising:
   forming a second structure in a pFET device region of the semiconductor substrate, the second structure comprising a pFET bottom source/drain structure comprising an p-doped semiconductor material region and a p-doped extension region, a pFET semiconductor channel material pillar extending upwards from the p-doped extension region, and a pFET gate stack located on each sidewall of the pFET semiconductor channel material pillar; and
   forming a pFET top source/drain structure on and within an upper portion of the pFET semiconductor channel material pillar, wherein the forming the pFET top source/drain structure is performed prior to, after, or simultaneously with, the forming of the p-doped top source/drain structure and is performed utilizing an epitaxial growth process that is carried out at a temperature of 550° C. or less.

8. The method of claim 7, wherein the forming the second structure occurs prior to, or after, the forming of the first structure.

9. The method of claim 7, wherein the pFET top source/drain structure of the pFET vertical transistor and the p-doped top source/drain structure of the nFET vertical transistor both comprise a boron doped silicon germanium alloy.

10. The method of claim 1, further comprising forming an additional interlevel dielectric material (ILD) on a surface of the recessed ILD material and surrounding the p-doped top source/drain structure.

11. The method of claim 1, wherein the p-doped top source/drain structure is located on a sidewall surface and a topmost surface of the n-doped semiconductor region.

12. The method of claim 1, wherein the nFET semiconductor channel material pillar is an undoped semiconductor material.

13. The method of claim 1, further comprising an nFET bottom gate spacer formed between the nFET gate stack and the n-doped semiconductor material region and having a sidewall directly contacting a sidewall of the n-doped extension region.

14. The method of claim 13, further comprising an nFET top gate spacer located on a topmost surface of the nFET gate stack and having a sidewall directly contacting a sidewall of the n-doped semiconductor region.

* * * * *